(12) United States Patent
Balcome et al.

(10) Patent No.: US 6,991,473 B1
(45) Date of Patent: Jan. 31, 2006

(54) ELECTRICAL CONNECTOR WITH ELASTOMERIC PAD HAVING COMPRESSOR FINGERS EACH INCLUDING A FILLER MEMBER TO MITIGATE RELAXATION OF THE ELASTOMER

(75) Inventors: Gregory Ervin Balcome, Rochester, MN (US); Joseph Kuczynski, Rochester, MN (US); Kevin Albert Splittstoesser, Stewartville, MN (US); Timothy Jerome Tofil, Rochester, MN (US); Paul Alan Vermilyea, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/000,453

(22) Filed: Nov. 30, 2004

(51) Int. Cl.
*H01R 12/00* (2006.01)
*H05K 1/00* (2006.01)

(52) U.S. Cl. .......................... 439/67; 439/77; 439/493
(58) Field of Classification Search .................. 439/67, 439/77, 493, 72, 86, 73
See application file for complete search history.

(56) References Cited

U.S. PATENT DOCUMENTS

| | | | |
|---|---|---|---|
| 4,003,621 A | 1/1977 | Lamp | 339/59 M |
| 4,902,234 A * | 2/1990 | Brodsky et al. | 439/67 |
| 4,927,368 A * | 5/1990 | Shino | 439/66 |
| 5,037,312 A * | 8/1991 | Casciotti et al. | 439/66 |
| 5,059,129 A * | 10/1991 | Brodsky et al. | 439/67 |
| 5,575,662 A * | 11/1996 | Yamamoto et al. | 439/67 |
| 5,585,138 A | 12/1996 | Inasaka | 427/125 |
| 5,899,757 A * | 5/1999 | Neidich et al. | 439/67 |
| 5,947,750 A * | 9/1999 | Alcoe et al. | 439/67 |
| 6,054,651 A | 4/2000 | Fogel et al. | 174/110 F |
| 6,334,247 B1 | 1/2002 | Beaman et al. | 29/842 |
| 6,500,027 B1 | 12/2002 | Van Der Sanden et al. | 439/587 |
| 6,607,120 B1 | 8/2003 | Neidich et al. | 228/180.22 |
| 6,814,589 B1 | 11/2004 | Kuczynski et al. | 439/67 |
| 2002/0155728 A1 | 10/2002 | Khandros et al. | |

OTHER PUBLICATIONS

Copending U.S. Appl. No. 10/929,474, filed Aug. 31, 2004, entitled "Electrical Connector with Elastomeric Element and Restrainer Member to Offset Relaxation of the Elastomer".

* cited by examiner

*Primary Examiner*—Hae Moon Hyeon
(74) *Attorney, Agent, or Firm*—Matthew J. Bussan

(57) ABSTRACT

An electrical connector includes connector pads on a printed circuit board and contact members on an insulating substrate. The contact members are pressed against the contact pads by a compression mat having compressor fingers. A clamping arrangement forces the compressor fingers against the substrate and thereby presses the contact members against the contact pads. To counteract the inherent tendency of the compressor fingers to undergo stress relaxation after the compressor mat has been clamped, the connector also includes filler members disposed at least partially within the compressor fingers, essentially a "button-within-a-button" arrangement. Optionally, a filler deflection member may be interposed between the compression mat and a clamping plate of the clamping arrangement so that the filler deflection member abuts against the filler members. Alternatively, the filler members may be integral features of the deflection member.

27 Claims, 7 Drawing Sheets

ELECTRICAL CONNECTOR WITH ELASTOMERIC PAD HAVING COMPRESSOR FINGERS EACH INCLUDING A FILLER MEMBER TO MITIGATE RELAXATION OF THE ELASTOMER

CROSS-REFERENCE TO RELATED APPLICATION

This patent application is related to a pending U.S. patent application Ser. No. 10/929,474, filed Aug. 31, 2004, which is a divisional of U.S. patent application Ser. No. 10/691,294 that has issued as U.S. Pat. No. 6,814,589, entitled "ELECTRICAL CONNECTOR WITH ELASTOMERIC ELEMENT AND RESTRAINER MEMBER TO OFFSET RELAXATION OF THE ELASTOMER", both of which are assigned to the assignee of the instant application.

BACKGROUND OF THE INVENTION

1. Field of Invention

The present invention relates in general to the electrical connector field. More particularly, the present invention relates to an electrical connector of the type that uses a compression mat made out of elastomer material to press contact members against contact pads.

2. Background Art

Connectors are in widespread use in the electronics industry. One class of electrical connectors employs a first mechanical support that holds first contacts and a second mechanical support the holds second contacts. In use the first and second contacts are either pressed against one another or inserted one inside the other. One disadvantage of this class of connector is that at least one of the first and second mechanical supports must typically be mounted on a housing or other structure, and the contacts must be soldered to conductors.

In another class of connectors, printed circuit wiring extends to the edge of a printed circuit board. The edge of the printed circuit board is inserted into a fixture having contacts that engage the wiring.

In a further class of connectors, contact members on a ribbon cable are pressed against contact pads on a printed circuit board. Pressure is exerted on the back of the ribbon cable by a compression mat having compressor fingers that are aligned with the contact members and contact pads. The compression mat is clamped to the printed circuit board. The compression mat and its compressor fingers are made of elastomer materials, and the compressor fingers act somewhat as springs. When the clamping arrangement is tightened, the compressor fingers are placed under a state of compression and bulge outward, like small barrels. A connector of this type is disclosed in U.S. Pat. No. 6,607,120.

Connectors of this latter type have a drawback in that the elastomer material of the compression mat has the tendency to relax after the clamping arrangement has been tightened to a desired state. The compressor fingers bulge outward to assume a barrel-like shape. The relaxation of the material reduces the pressure forcing the contact members against the connector pads, and thus may lead to faulty connections due to decreasing actuation load with the passage of time.

One might consider adjusting the geometry or hardness of a compression mat in an attempt to minimize this stress relaxation. However, as the hardness of a compression mat increases, so does the actuation load that is required to compress the compressor fingers to the necessary degree. Furthermore, attempts might be made to shorten the compressor fingers in an attempt to minimize stress relaxation, but shorter compression fingers pose reliability concerns due to assembly tolerance stack (e.g., compressor fingers that are not quite long enough but are still within tolerance may not press the contact members against the contact pads with sufficient force to ensure a reliable connection).

Another problem with conventional compression mats is that the compressor fingers are prone to off-axis loading, so that one or more compressor fingers may skew to one side. This phenomenon, too, is detrimental to reliability.

SUMMARY OF THE INVENTION

The primary object of the present invention is to provide a connector which employs an elastomeric compression mat for pressing contact members against contact pads on a printed circuit board, but without the drawbacks discussed above with respect to the prior art.

A related object is to improve the reliability of a connector which employs a compression mat to force contact members against contact pads.

A further object is to provide filler members disposed at least partially within compressor fingers of a compression mat that reduce the tendency of the compressor fingers to relax after initial compression and which may also reduce skewing of the compressor fingers.

In accordance with one aspect of the invention, these and other objects that will become apparent in the ensuing detailed description can be attained by providing a connector that includes connector pads in a contact region on a printed circuit board and contact members that are disposed in a contact region on a first side of an insulating substrate. The contact region of the substrate is aligned with the contact region of the printed circuit board. The connector also includes a compression mat having compressor fingers that contact a second side of the substrate in alignment with the contact members on the first side, and a clamping arrangement to press the compression mat toward the printed circuit board. In order to counteract the inherent tendency of the compressor fingers to undergo stress relaxation after the compressor mat has been clamped, the connector also includes a plurality of filler members, with each filler member being disposed at least partially within one of the compressor fingers. This is referred to herein as a "button-within-a-button" arrangement. Optionally, a filler deflection member that abuts an end surface of the filler members may be interposed between the compression mat and a clamping plate of clamping arrangement. Alternatively, the filler members may be integral features of the deflection member. The filler deflection member may be used, for example, if additional compressive forces are needed to establish a positive and reliable connection between the contact members and the contact pads.

In accordance with another aspect of the invention, a compression mat having compression fingers is used in conjunction with filler members in a method for electrically connecting pads that are disposed within a contact region on a printed circuit board to contact members that are disposed within a contact region on a first side on an insulating substrate. The method includes the step providing each of the compressor fingers with a filler member extending at least partially into the compressor finger. The method also includes the step of placing the contact region of the substrate in a face-to-face relationship with the contact region of the printed circuit board and the step of positioning the compressor mat adjacent to a second side of the substrate, with the compressor fingers being aligned with the contact members on the first side of the substrate. Finally, the method includes the step of pressing the compression mat toward the printed circuit board. Optionally, the method may include the additional step of interposing a filler deflection member between the compression mat and a clamping plate of a clamping arrangement that secures the substrate, the compression mat, and the filler deflection member to the printed circuit board. In this optional embodiment, the filler deflection member abuts an end surface of the filler members. Alternatively, the filler members may be integral features of the deflection member.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS

Figure 1:
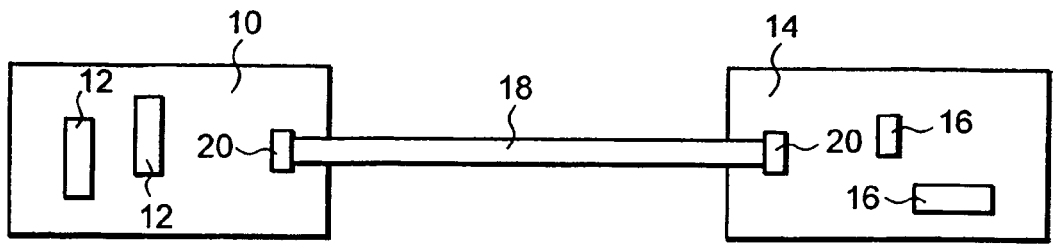
FIG. 1 is a top view schematically illustrating two printed circuit boards and a ribbon cable that connects them by way of two connectors in accordance with the present invention.

The present invention is directed to an improved connector that can be used, for example, to connect a ribbon cable to contact pads on an integrated circuit board. The use of the present invention to connect ribbon cables is exemplary and not limiting. Those skilled in the art will appreciate that a connector in accordance with the present invention may be used in other applications. FIG. 1 illustrates a first printed circuit board 10 having circuitry such as integrated circuits 12 and a second printed circuit board 14 having circuitry such as integrated circuits 16. A ribbon cable 18 having a plurality of parallel conductors (not shown in FIG. 1) carries signals between the circuitry of the first and second printed circuit boards 10 and 14. Reference number 20 designates a clamping plate that is part of a connector 22 (shown in FIG. 4) that connects the left end of cable 18 to the circuitry on printed circuit board 10. Similarly, the right end of cable 18 is connected to the circuitry on printed circuit board 14 by a connector 22 that includes a clamping plate 20.

Figure 2:
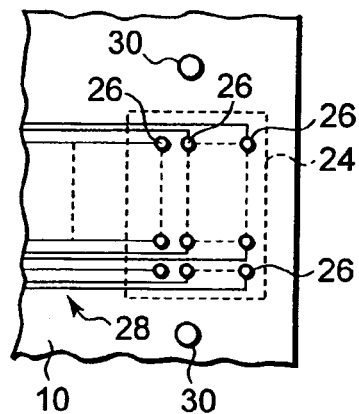
FIG. 2 is a top view of a contact region on a broken-away portion of one of the printed circuit boards of FIG. 1.

FIG. 2 illustrates a contact region 24 on the top side of printed circuit board 10. The region 24 contains an array of contact pads 26. Dotted lines that are shown on FIG. 2 between the contact pads 26 are intended to indicate that more contact pads are typically present in the contact region 24 that are shown in FIG. 2. Printed wiring 28 connects the contact pads 26 to the circuitry carried by the printed circuit board 10. The printed circuit board 10 is provided with alignment holes 30 adjacent the ends of the contact region 24.

Figure 3:
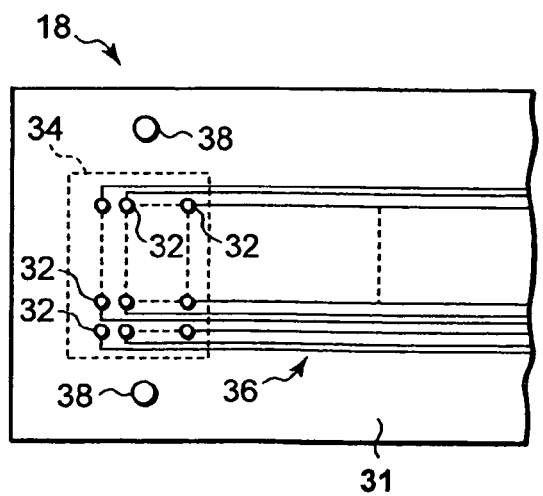
FIG. 3 is a bottom view of a contact region on a broken-away portion of the ribbon cable of FIG. 1.

FIG. 3 illustrates the bottom side of the left end of the ribbon cable 18. It includes a flexible plastic strip 31 with an array of contact members 32 that are grouped within a contact region 34. Dotted lines are used between the contact members 32 in FIG. 3 in order to indicate that more contact members are typically present than are actually shown in the drawing. Printed wiring 36 is carried by the strip 31 and connected to the contact members 32. Although the printed wiring 36 in FIG. 3 is located on the same side of strip 31 as the contact members 32, the wiring 36 may be provided on the reverse side of the strip 31 and connected electrically to the contract members 32 by plated through-holes (not shown). The strip 31 is provided with an alignment hole 38 adjacent each end of the contact region 34.

When the ribbon cable 18 is inverted and the holes 38 are aligned with the holes 30 in the printed circuit board 10, the contact region 34 will be aligned with the contact region 24 and the contact members 32 of the ribbon cable 18 will be positioned directly above corresponding contact pads 26 on the printed circuit board 10.

Figure 4:
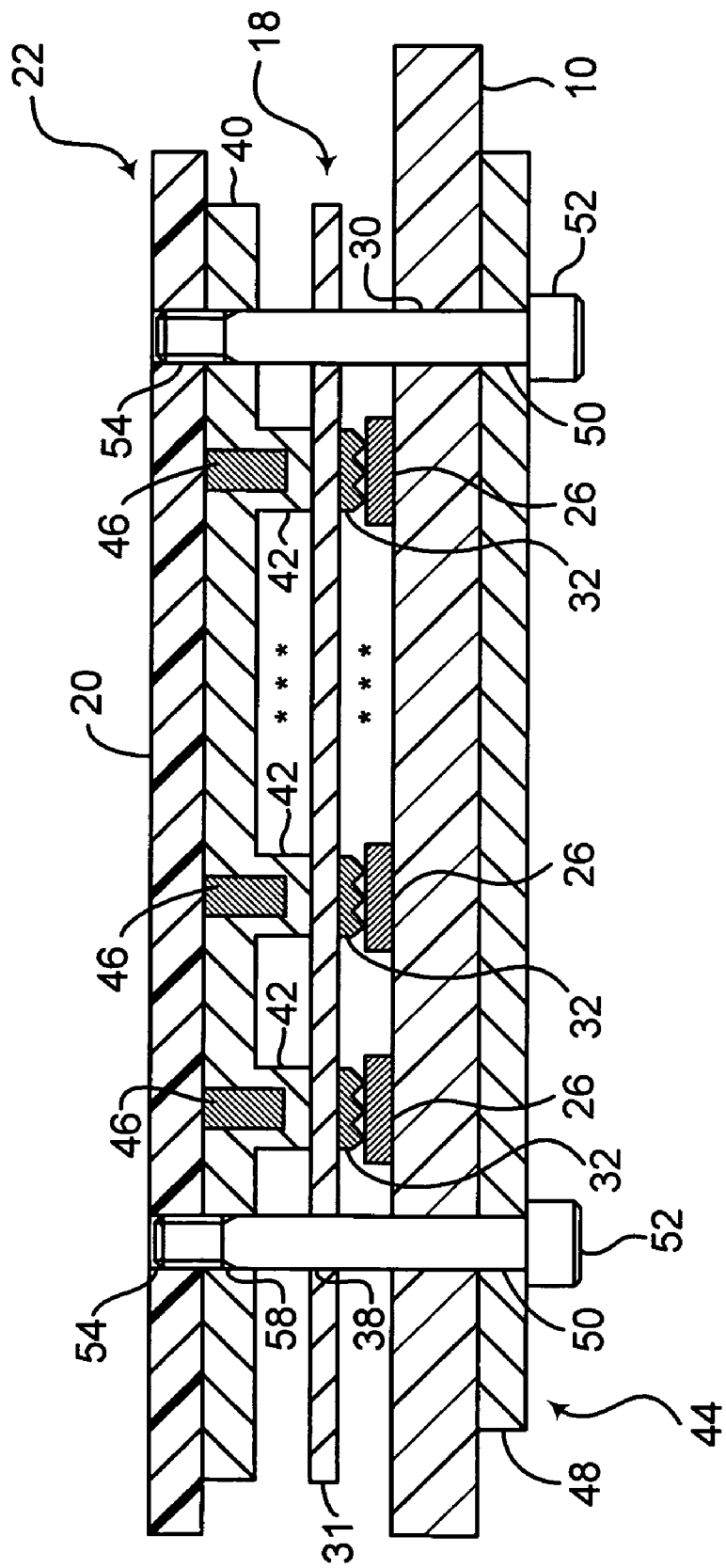
FIG. 4 is a cross-sectional view of a connector in accordance with the present invention.

With reference to FIGS. 2–4 together, the connector 22 includes contact pads 26, the contact members 32, a compressor mat 40 having an array of compressor fingers 42 that are located so as to press the contact members 32 against the contact pads 26, and a clamping assembly 44 that presses the compression mat 40 toward the printed circuit board 10. This exerts a compressive force on the compressor fingers 42, which act somewhat as springs. However, the compression mat 40 and its compressor fingers 42 are made of a rubbery, elastomeric material such as thermal silicone rubber. As discussed in the "Background of the Invention" section of this document, the elastomeric material has a tendency to relax over a period of time after it has been placed in a state of compression. The result is that the pressure forcing the contact members 32 against the contact pads 26 would ordinarily be reduced after the clamping assembly 44 is originally tightened. In order to reduce the tendency of the elastomeric material to relax, the connector 22 also includes filler members 46. Filler members 46 are made of a material having a stiffness, or durometer measurement, which is smaller or larger than that of the elastomeric material of the compression mat 40 and its compressor fingers 42. Each filler member 46 is disposed at least partially within one of the compressor fingers 42, essentially in a "button-within-a-button" arrangement.

The purpose of the clamping assembly 44 is to force the compression mat 40 toward the printed circuit board 10. It will be apparent that there are many possible ways to achieve this purpose and that the clamping assembly 44 may take many forms. In the form shown in FIG. 4, the clamping assembly 44 includes a clamping member 48 having two alignment holes 50 for passage of threaded metal bolts 52. The clamping member 48 is constructed of stainless steel or other suitable metal. The clamping assembly 44 also includes clamping plate 20 having two threaded holes 54 for receiving the threads of bolt 52. The clamping plate 20 is constructed of stainless steel or other suitable metal.

During assembly, the bolts 52 pass through the alignment holes 50 of clamping member 48, the alignment holes 30

(shown in FIGS. 2 and 4) of the printed circuit board 10, the alignment holes 38 (shown in FIGS. 3 and 4) of the ribbon cable 18, the alignment holes 58 (shown in FIGS. 4 and 5) of compression mat 40, and the threaded holes 54 of clamping plate 20. The bolts 52 are then tightened to compress the compression fingers 42 so as to force the contact members 32 tightly against the contact pads 26.

As mentioned above, the clamping assembly 44 may take many forms. In a modification of clamping assembly 44 shown in FIG. 4, ribbon cable 18 and compression mat 40 may be aligned by features on clamping plate 20 and/or a frame member. In this modification, which is discussed in detail below with reference to FIG. 6, alignment pins of clamping plate 20 and alignment posts of the frame member are used to align the ribbon cable 18 and the compression mat 40 in lieu of bolts 52 passing through the alignment holes 38 of ribbon cable 18 and the alignment holes 58 of compression mat 40.

The compression mat 40 may be made by compression molding, from (for example) thermal silicone rubber or other silicone-based material. Other suitable materials for compression mat 40 include polyurethane, flexibilized epoxies, and thermal elastomers. Preferably, compression mat 40 is compression molded with removable inserts present at selected locations in the compression mold. The inserts will subsequently be removed from compression mat 40 and replaced with filler members 46. Each insert is positioned in the compression mold so that it extends into an area of the mold that defines one of the compressor fingers 42. The silicone-based material (preferably, a precursor material in a liquid state) is injected around the inserts into the compression mold. Preferably, prior to injecting the silicone-based material into the compression mold, the inserts are coated with a conventional silicone mold release to aid in the subsequent removal of the inserts from the compression mat 40. Also, removal of the inserts may be aided by appropriate selection of the material from which the inserts are made. For example, the inserts may be made of stainless steel. The silicone-based material is then cured to form the compression mat 40 and its compressor fingers 42. After the compression mat 40 has cured, the inserts are removed from the compression mat 40 to form recesses. Then, the recesses are back-filled with (for example) a flexible epoxy adhesive (preferably, a precursor material in a liquid state) that is cured to form filler members 46. Other suitable materials for filler members 46 include thermal silicone rubber or other silicone-based materials, polyurethane, epoxies, acrylics, and thermal elastomers. Alternatively, the filler members 46 may be pre-formed and then placed into the recesses.

The inserts may be a part of the compression mold, or may be separate from the compression mold. In the former case, the inserts may extend directly from the mold face. In the latter case, the inserts may extend (in unitary fashion) from a mold attachment plate placed on the mold face, or may be individually placed on the mold face.

In another alternative, the recesses may be cut into the compression mat 40. For example, the recesses may be cut into a commercially available compression mat using a laser. Compression mats with compression fingers are commercially available from (for example) InterCon Systems, Inc., of Harrisburg, Pa. as part of their C-BYTE™ connector system. In still another alternative, the compression mat 40 may be compression molded with filler members 46 preformed and present in the compression mold.

The filler members 46 are made of a material harder or softer than that of compression pad 40 and its compressor fingers 42 to achieve the desired effect, e.g., mitigating stress relaxation and/or skewing. Additionally, the dimensions, i.e., height and width, of the filler members 46 can be varied to achieve the desired effect. The normal force required to compress the compression pad 40 and its compressor fingers 42 to the nominal deflection can be adjusted, as well as the degree to which stress relaxation and/or skewing occurs. It is typically desirable to compress the compression mat 40 and its compressor fingers between about 16–31 mils (24 nominal) to achieve the required contact force between contact members 32 and contact pads 26. However, those skilled in the art will appreciate that the magnitude of the desired compression is a function of the compression mat geometry and stiffness. Consequently, the desired deflection may be stated as a percentage of button height. The greater the compression of compression mat 40, the greater the stress relaxation.

Figure 5:
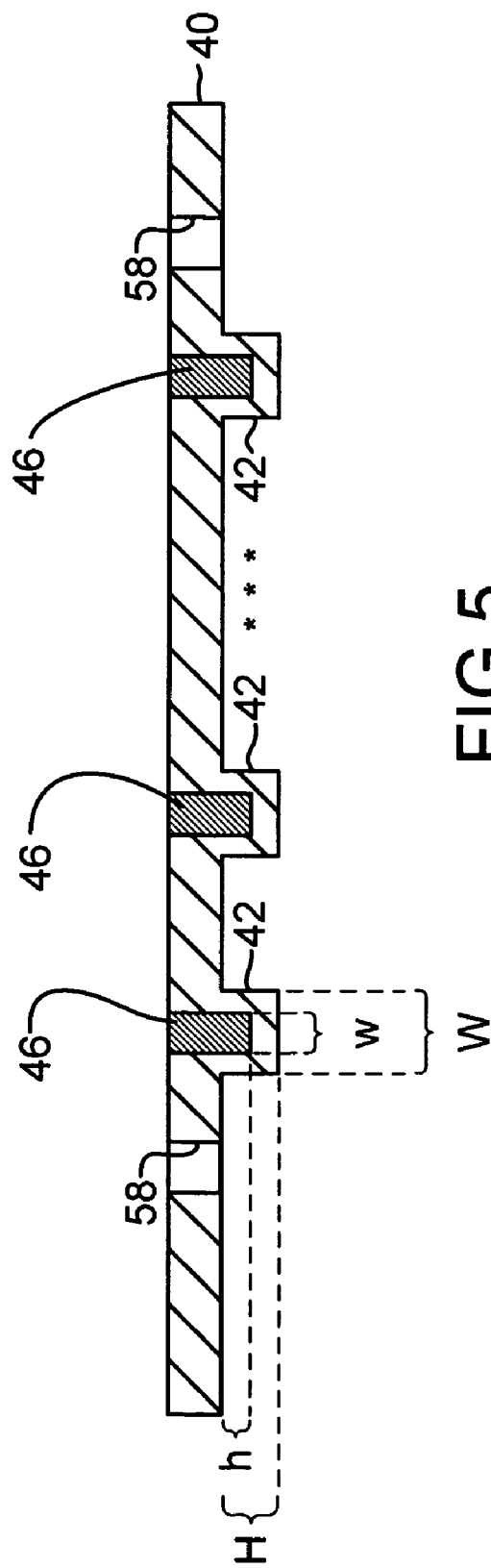
FIG. 5 is a cross-sectional view on a broken-away portion of the compression mat of FIG. 4 showing in more detail the compressor fingers and the filler members.

Referring now to FIG. 5, the filler members 46 preferably have a height (denoted as "h" in FIG. 5) extending into the compressor fingers 42 about equal to one half of the height (denoted as "H" in FIG. 5) of compressor fingers 42. Similarly, the filler members 46 preferably have a width (denoted as "w" in FIG. 5) about equal to one half of the width (denoted as "W" in FIG. 5) of compressor fingers 42. However, the height and width ratios may be varied to achieve the desired effect. Those skilled in the art will appreciate that the spirit and scope of the invention are not limited to the preferred height and width ratios.

Figure 6:
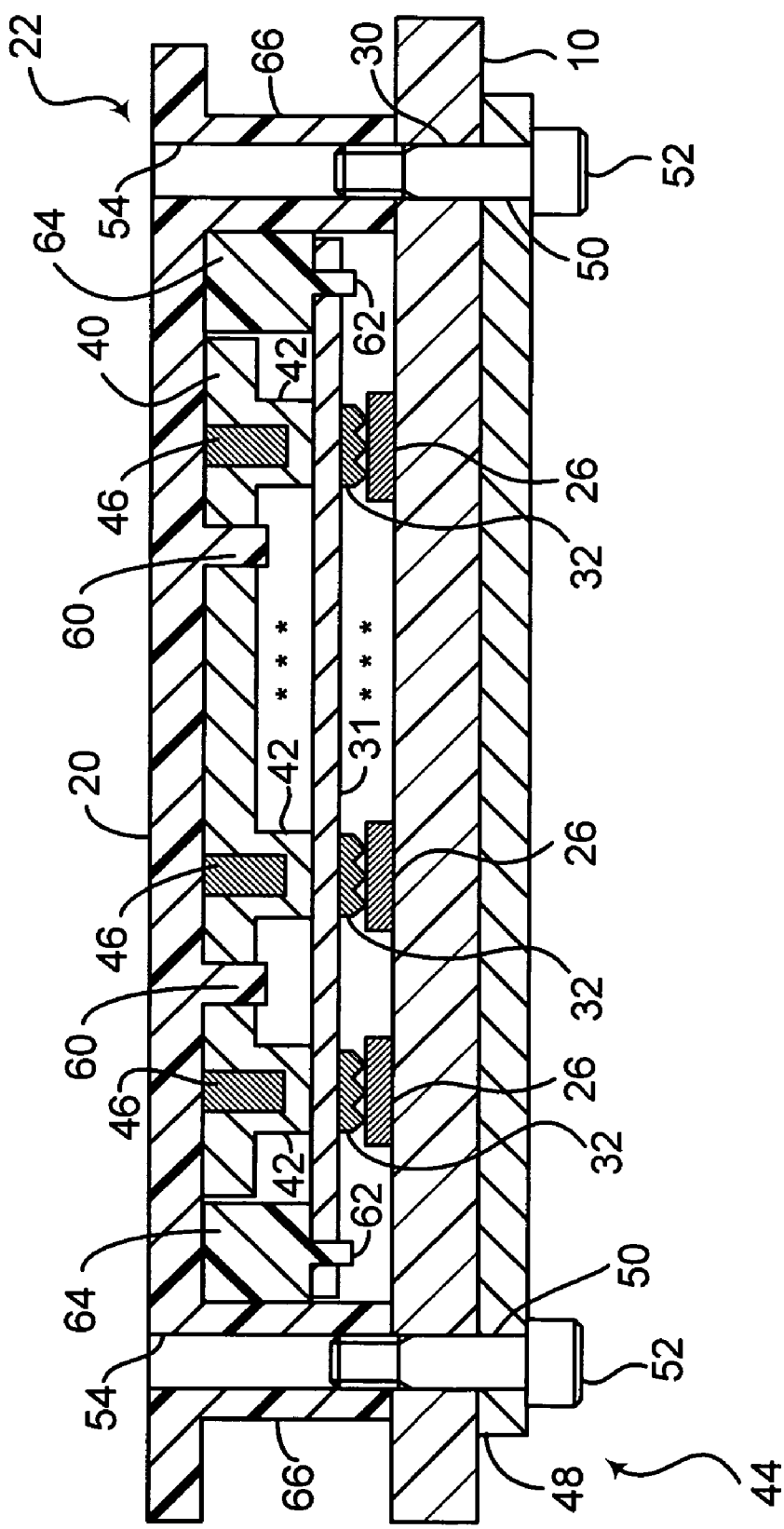
FIG. 6 is a cross-sectional view of a connector in accordance with a modified embodiment of the present invention having alignment pins on a clamping plate and alignment posts on a frame member.

FIG. 6 shows a modified embodiment of the present invention having alignment pins 60 protruding from the lower surface of clamping plate 20 and alignment posts 62 protruding from the lower surface of a frame member 64. The frame member 64 surrounds compression pad 40 in a manner similar to a picture frame surrounding a picture. The frame member 64 is located between clamping protrusions 66 that extend from the lower surface of clamping plate 20. The frame member 64 is constructed of plastic or some other suitable insulating material. The alignment pins 60 of clamping plate 20 are used to align the compression mat 40 which contains corresponding alignment holes. The alignment posts 62 of frame member 64 are used to align the flexible plastic strip 31 of the ribbon cable which contains corresponding alignment holes. These features are used in this modified embodiment in lieu of bolts 52 passing through the ribbon cable and the compression mat as in the previous embodiment. The clamping protrusions 66 contain threaded holes 54 for receiving the threads of bolts 52. The height at which protrusions 66 extend from the lower surface of clamping plate 20 is selected to permit the desired compression of the compression mat 40 and compressor fingers 42 when the bolts 52 are tightened.

Figure 7:
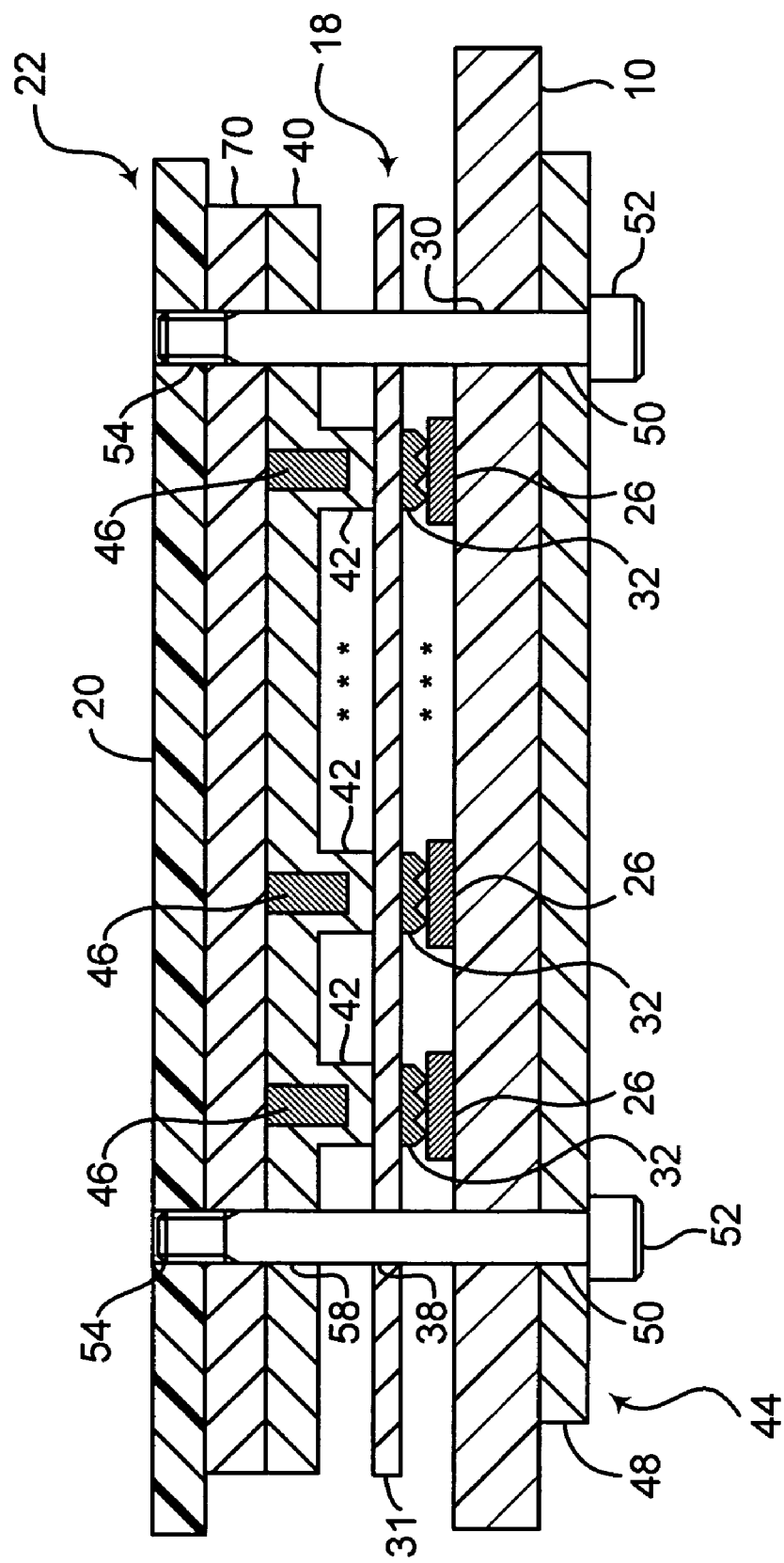
FIG. 7 is a cross-sectional view of a connector in accordance with another modified embodiment of the present invention having a filler deflection member.

FIG. 7 shows a modified embodiment of the present invention with a filler deflection member 70 interposed between clamping plate 20 and compression pad 40. The end surfaces of the filler members 46 abut against an adjacent surface of filler deflection member 70. Alternatively, the filler members 46 may be integral features (such as cylindrical protrusions) of the filler deflection member 70. That is, the filler members 46 may be integrally formed with the deflection member 70 as a unitary structure. The filler deflection member 70 may be made by compression molding, from (for example) thermal silicone rubber or other silicone-based material. Other suitable materials for filler deflection member 70 include polyurethane, flexibilized epoxies, and thermal elastomers. Because it is elastic, filler deflection member 70 causes an opposite deflection force to be applied to the filler members 46 once the clamping assembly 44 has been compressed. The filler deflection member 70 could be used, for example, if additional compressive forces are needed to establish a positive and reliable connection between contact members 32 on flexible plastic strip 31 and contact pads 26 on printed circuit board 10.

Figure 8:
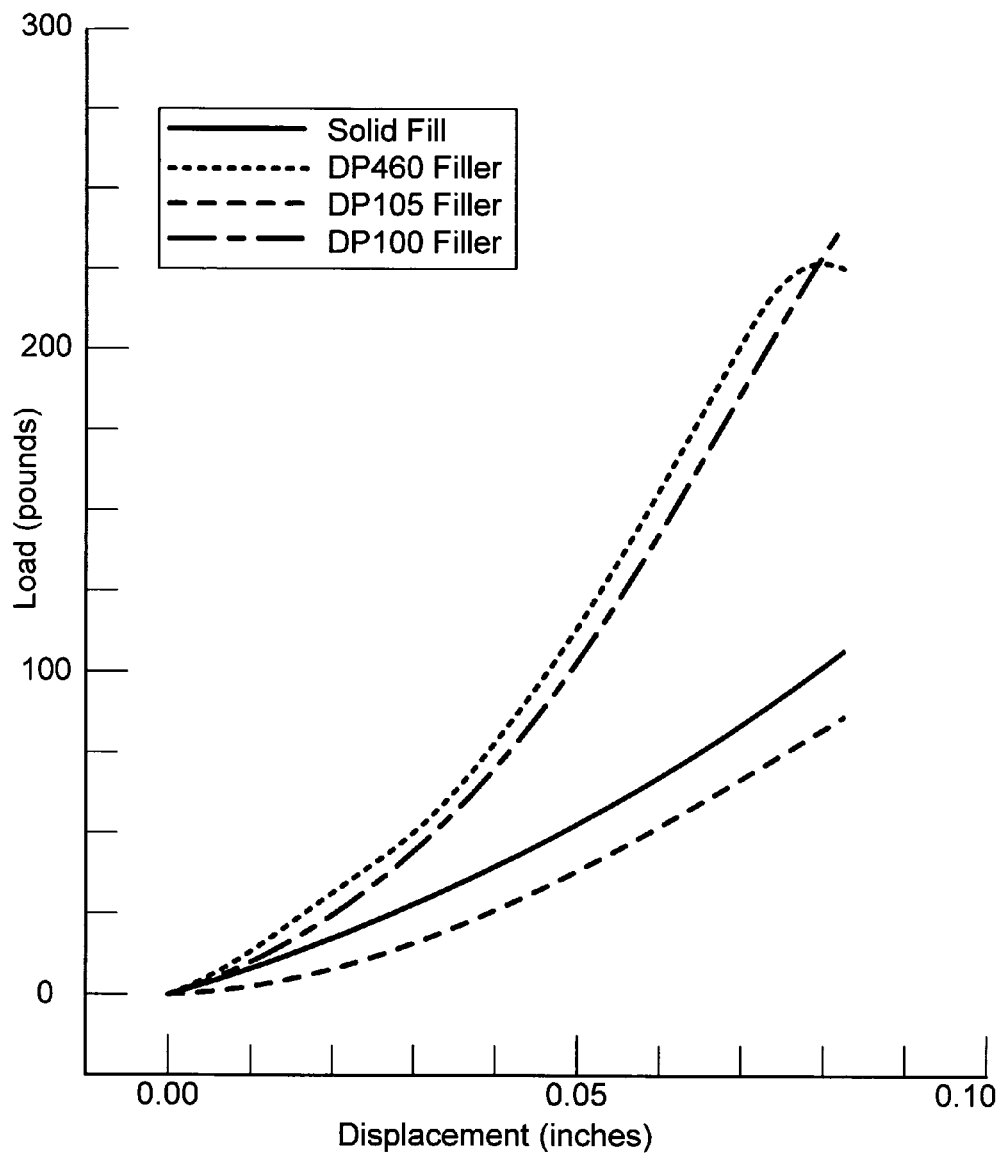
FIG. 8 is a plot of load versus displacement for exemplary compression mats having filler members in accordance with the present invention.
Figure 9:
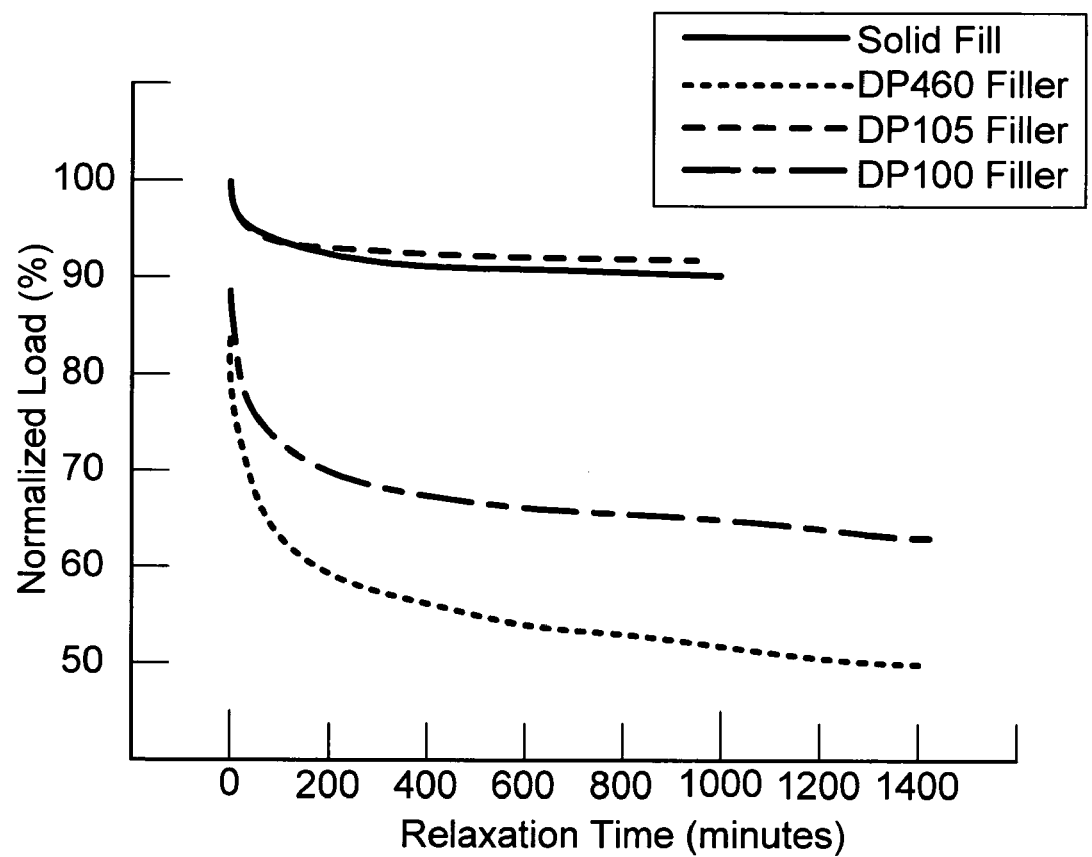
FIG. 9 is a plot of normalized load versus relaxation time for exemplary compression mats having filler members in accordance with the present invention.

FIG. 8 is a plot of load versus displacement for exemplary compression mats having filler members in accordance with the present invention. FIG. 9 is a plot of normalized load versus relaxation time for the same exemplary compression mats. In each case, the height of filler members extending into the compressor fingers was one half that of the compressor fingers. Similarly, the width of the filler members was one half that of the compressor fingers. In each case the compression pad and its compressor fingers were made of Dow Corning RTV 627 silicone rubber compound (commercially available from Dow Corning, Midland, Mich.) cured for 30 minutes at 150° C. Four materials were used to form the filler members. In one case, Dow Corning RTV 627 silicone rubber compound was used to form filler members as a control example. In the remaining cases, three different epoxy adhesive materials having varying hardness relative to the compression pad and its compressor fingers were used to form the filler members. These epoxy adhesive materials were 3M DP460, 3M DP100 and 3M DP105 (commercially available from 3M Company, St. Paul, Minn.). The epoxy adhesive materials were cured for 24 hours at ambient temperature. In each case, the clamping assembly was tightened to provide compression of 0.083 inches to the compression pad and its compression fingers. The resulting force-deflection curves are illustrated in FIG. 8, while stress relaxation results are tabulated below and graphically illustrated in FIG. 9.

| Fill Material | Shore A Hardness | Deflection Force (lbs) | Relaxation % |
| --- | --- | --- | --- |
| Dow Corning RTV627 | 64 | 104.0 | 10.1 |
| 3M DP460 | >100 | 227.7 | 50.7 |
| 3M DP100 | 88 | 238.0 | 36.8 |
| 3M DP105 | 44 | 86.4 | 8.8 |

When the filler members were made of a material that is harder than the compression mat and its compressor fingers, the deflection force drastically increases. This occurred with respect to the filler members made of 3M DP460 and 3M DP100. In fact, for the filler members made of 3M DP460 (where the Shore A hardness was greater than the scale maximum), the compressor fingers fractured. The utility of the present invention is best illustrated among these examples with filler members made of 3M DP 105 which is a material that is softer than that of compression mat and its compressor fingers. In that example, the stress relaxation was reduced to 8.8%. This compares favorably with the stress relaxation of 10.1% for the control example and in excess of 45% for commercially available solid silicone compression pads having compression fingers.

It will be apparent to those ordinarily skilled in the art that the embodiments described above are susceptible to various changes, modifications, and adaptations, and it is intended that such changes, modifications, and adaptations be covered by the appended claims.

What is claimed is:

1. A connector for providing electrical connections to wiring on a printed circuit board, comprising:
    connector pads disposed within a contact region on the printed circuit board;
    an insulating substrate having first and second sides;
    contact members disposed within a contact region on the first side of the substrate, the contact region of the substrate being aligned with the contact region of the printed circuit board;
    a compression mat having compressor fingers that contact the second side of the substrate in alignment with the contact regions on the first side;
    a clamping arrangement that presses the compression mat toward the printed circuit board;
    a plurality of filler members, each filler member disposed at least partially within one of the compressor fingers.

2. The connector as recited in claim 1, wherein the substrate comprises a flexible plastic strip of a ribbon cable.

3. The connector as recited in claim 1, wherein the filler members are made of a material softer than that of the compressor fingers.

4. The connector as recited in claim 3, wherein the filler members comprise a flexible epoxy adhesive.

5. The connector as recited in claim 1, wherein the filler members are made of a material harder than that of the compressor fingers.

6. The connector as recited in claim 1, wherein the filler members are made of an epoxy adhesive and the compressor fingers are made of silicone rubber compound.

7. The connector as recited in claim 6, wherein the epoxy adhesive has a Shore A hardness of about 44 and the silicone rubber compound has a Shore A hardness of about 64.

8. The connector as recited in claim 1, wherein the filler members have a height within the compressor finger and extending perpendicular to a plane of the compression mat about one half that of the compressor fingers.

9. The connector as recited in claim 8, wherein the filler members have a width extending parallel to the plane of the compression mat about one half that of the compressor fingers.

10. The connector as recited in claim 1, wherein the filler members are made by depositing a precursor material in a liquid state into recesses on a surface of the compression mat and then curing the precursor material, each of the recesses extending at least partially into one of the compressor fingers.

11. The connector as recited in claim 1, wherein the compression pad is made by injecting a precursor material in a liquid state into a mold around inserts and then curing the precursor material, each insert extending into an area of the mold that defines one of the compressor fingers.

12. The connector as recited in claim 11, wherein the compression pad is further made by removing the inserts to form recesses after the precursor material has cured.

13. The connector as recited in claim 12, wherein the filler members are made by depositing a precursor material in a liquid state into the recesses and then curing the precursor material.

14. The connector as recited in claim 1, further comprising a filler deflection member that abuts an end surface of the filler members and is interposed between the compression mat and a clamping plate of the clamping arrangement.

15. The connector as recited in claim 14, wherein the filler deflection member is made of resilient material.

16. The connector as recited in claim 15, wherein the resilient material comprises a silicone.

17. The connector as recited in claim 1, further comprising a filler deflection member interposed between the compression mat and a clamping plate of the clamping arrangement, wherein the filler members are integral features of the filler deflection member that are integrally formed with the filler deflection member in a unitary structure.

18. A method for electrically connecting connector pads disposed within a contact region on a printed circuit board to contact members disposed within a contact region on a first side of an insulating substrate, comprising the steps of:
- (a) providing each of a plurality of compressor fingers of a compression mat with a filler member extending at least partially into the compressor finger;
- (b) placing the contact region of the substrate in face-to-face relationship with the contact region of the printed circuit board;
- (c) positioning the compression mat adjacent a second side of the substrate, with the compressor fingers being aligned with the contact members on the first side;
- (d) pressing the compression mat toward the printed circuit board.

19. The method as recited in claim 18, wherein the filler members are made of a material that has a hardness that is different than that of the compressor fingers.

20. The method as recited in claim 18, wherein step (d) comprises tightening fastening members of a clamping arrangement that secures the substrate and the compression mat to the printed circuit board.

21. The method as recited in claim 18, wherein step (a) comprises the steps of:

depositing a liquid material into recesses on a surface of the compression mat, each of the recesses extending at least partially into one of the compressor fingers;

hardening the liquid material to form the filler members extending at least partially into the compressor fingers.

22. The method as recited in claim 21, wherein the liquid material is an epoxy adhesive, and the step of hardening the liquid material comprises curing the epoxy adhesive.

23. The method as recited in claim 18, wherein step (a) comprises the steps of:

injecting a precursor material in a liquid state into a mold around inserts, each insert extending into an area of the mold that defines one of the compressor fingers;

curing the precursor material to form the compression mat;

removing the inserts from the compression mat to form recesses;

depositing a precursor material in a liquid state into the recesses;

curing the precursor material to form the filler members.

24. The method as recited in claim 18, further comprising the step of interposing a filler deflection member between the compression mat and a clamping plate of a clamping arrangement that secures the substrate, the compression mat, and the filler deflection member to the printed circuit board, wherein the filler deflection member abuts an end surface of the filler members.

25. The method as recited in claim 24, wherein the filler deflection member is made of resilient material.

26. The method as recited in claim 25, wherein the resilient material comprises a silicone.

27. The method as recited in claim 18, further comprising the step of interposing a filler deflection member between the compression mat and a clamping plate of a clamping arrangement that secures the substrate, the compression mat, and the filler deflection member to the printed circuit board, wherein the filler members are integral features of the filler deflection member that are integrally formed with the filler deflection member in a unitary structure.

* * * * *